US008295116B2

(12) United States Patent
Chen et al.

(10) Patent No.: US 8,295,116 B2
(45) Date of Patent: Oct. 23, 2012

(54) CIRCUIT AND METHOD OF PROVIDING CURRENT COMPENSATION

(75) Inventors: Yen-Huei Chen, Hsinchu (TW); Shao-Yu Chou, Chu Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 248 days.

(21) Appl. No.: 12/767,178

(22) Filed: Apr. 26, 2010

(65) Prior Publication Data

US 2010/0278002 A1 Nov. 4, 2010

Related U.S. Application Data

(60) Provisional application No. 61/174,640, filed on May 1, 2009.

(51) Int. Cl.
*G11C 5/14* (2006.01)

(52) U.S. Cl. .................................. 365/226; 365/189.05

(58) Field of Classification Search .................. 365/226, 365/189.05
See application file for complete search history.

(56) References Cited

U.S. PATENT DOCUMENTS

| 6,525,896 B2 * | 2/2003 | Chung et al. .................... 360/68 |
| 2002/0075729 A1 * | 6/2002 | Choi ........................ 365/189.11 |
| 2004/0246214 A1 * | 12/2004 | Yu et al. ........................ 345/87 |
| 2008/0192126 A1 * | 8/2008 | Purcell et al. .............. 348/222.1 |

FOREIGN PATENT DOCUMENTS

| JP | 2004349907 A | * | 12/2004 |
| JP | 2006228414 A | * | 8/2006 |

* cited by examiner

*Primary Examiner* — Michael Tran
(74) *Attorney, Agent, or Firm* — Lowe Hauptman Ham & Berner, LLP

(57) ABSTRACT

Some embodiments regard a method comprising: during a leakage sampling phase, recognizing a voltage level dropped due to a leakage current associated with a signal line storing the voltage level; and during a reading phase, using the voltage level to provide an amount of compensation current to the signal line.

20 Claims, 4 Drawing Sheets

CIRCUIT AND METHOD OF PROVIDING CURRENT COMPENSATION

CROSS-REFERENCE TO RELATED APPLICATIONS

The present application claims priority of U.S. Provisional Patent Application Ser. No. 61/174,640, filed on May 1, 2009, which is incorporated herein by reference in its entirety.

TECHNICAL FIELD

The present disclosure is related to current leakage. Various embodiments provide current compensation for bit line leakage in single-ended SRAMs.

BACKGROUND

Single-ended read Static Random Access Memory (SRAM) has been widely used in the industry because it can separate read and write operations to achieve lower minimum operating supply voltage (e.g., Vdd). Its large bit line leakage, however, could result in misread, especially in a long bit line scheme. Worst case current leakage to a bit line generally occurs when reading a cell storing a low while other cells are storing a high. When this happens, the current leakage causes a large voltage drop in the read bit line signal and thus can cause misread. Some approaches use a "keeper" to hold the reading state to avoid the misread. In many designs, however, the keeper is always on and thus can pull the logic level of the memory cell to be read in an undesirable direction.

BRIEF DESCRIPTION OF THE DRAWINGS

The details of one or more embodiments are set forth in the accompanying drawings and the description below. Other features and advantages will be apparent from the description, drawings, and claims.

Like reference symbols in the various drawings indicate like elements.

DETAILED DESCRIPTION

Figure 1:
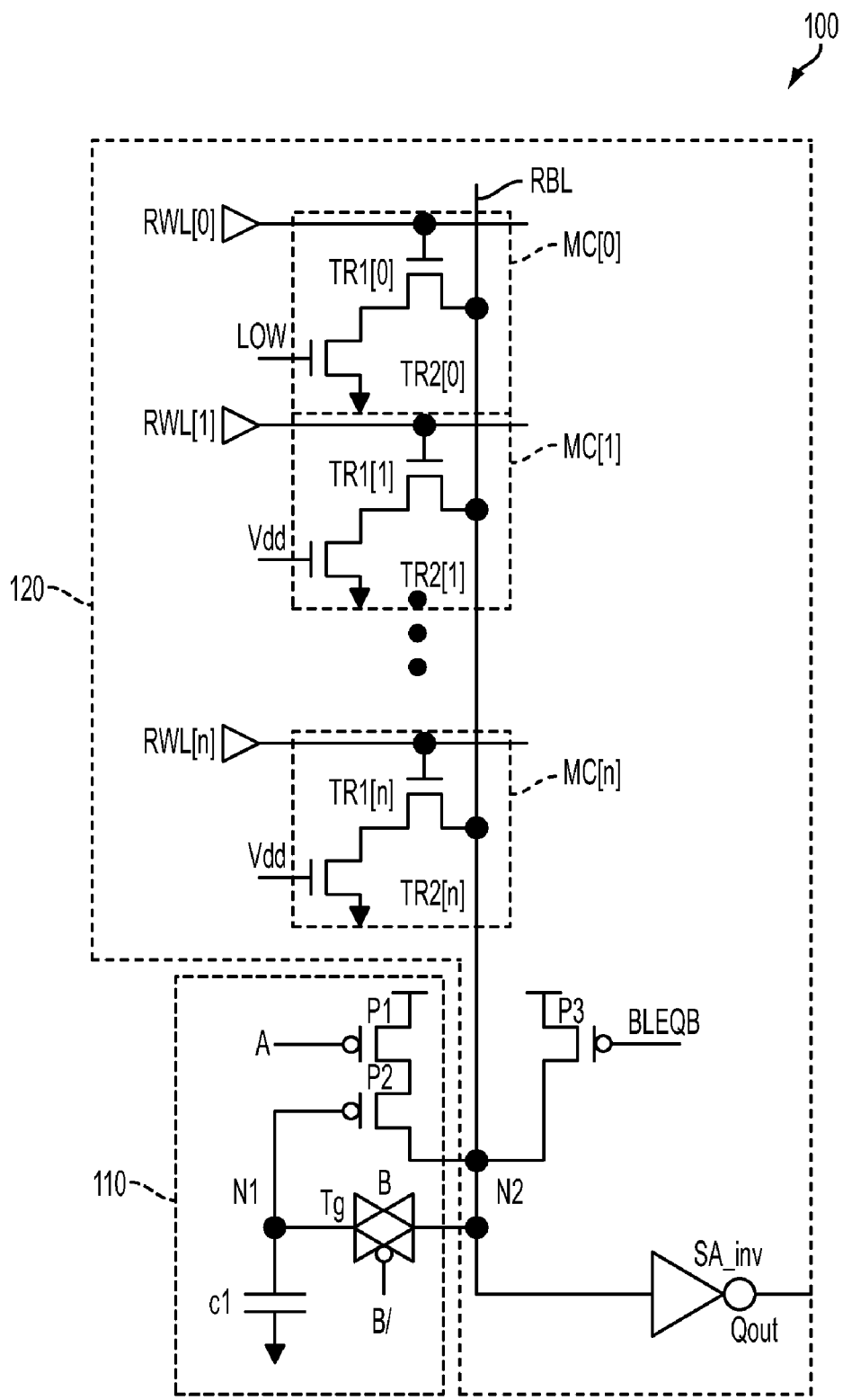
FIG. 1 shows an exemplary circuit according to an embodiment of the invention.

Embodiments, or examples, of the invention illustrated in the drawings are now being described using specific languages. It will nevertheless be understood that no limitation of the scope of the invention is thereby intended. Any alterations and modifications in the described embodiments, and any further applications of principles of the invention described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

A Compensation Circuit Embodiment in Operation with a Single-Ended SRAM

FIG. 1 shows an exemplary circuit 100 according to an embodiment of the invention that includes an exemplary single-ended SRAM 120 and an embodiment of a compensation circuit 110.

Each memory cell MC of SRAM 120 corresponds to a signal read word line RWL. For illustration, only a pair of transistors TR1 and TR2 of each memory cell MC are shown, but other components including, for example, the cross latch, are not shown. Transistors TR1 and TR2 of a memory cell are configured to allow access to the corresponding memory cell (e.g., by turning it on or off). Transistor TR1 of a memory cell MC controls (e.g., turns on/off) that memory cell MC. For example regarding memory cell MC[0], if signal RWL[0] is activated (e.g., at a high voltage level, or "high" hereinafter for simplicity), it turns on transistor TR1[0] and if signal RWL[0] is deactivated (e.g., at a low voltage level, or "low" hereinafter for simplicity), it turns off transistor TR1[0]. Transistor TR1[0], when being off, disconnects signal line RBL from transistor TR2[0], and, when being on, allows current to flow through transistor TR1[0] and TR2[0]. The data at the gate of transistor TR2 represents the data stored by the memory cell MC. For example, if the gate of transistor TR2[0] is low then memory cell MC[0] stores a low, and if the gate of transistor TR2[0] is high then memory cell MC[0] stores a high. Generally, to read a memory cell MC (e.g., cell MC[0]), signal line RBL is configured to be high, the signal RWL (e.g., RWL[0]) for that memory cell MC[0] is activated, which turns on the corresponding transistor TR1 (e.g., transistor TR1[0]). If memory cell MC[0] stores a low, then transistor TR2[0] is off, signal line RBL is high, which, via sense amplifier inverter SA_INV, provides a low at output Qout. If memory cell MC[0], however, stores a high, then transistor TR2[0] is on, and current flows from signal line RBL through transistors TR1[0] and TR2[0] to ground, resulting in a low at signal line RBL, which, in turns, provides a high at output Qout.

Because the data at the gate of each transistor TR2 (e.g., TR2[0], TR2[1], . . . , TR2[N], etc.) represents the data stored by a corresponding memory cell MC, the data low, Vdd, and Vdd at the gate of transistor TR2[0], TR2[1], and TR2[N] as shown in FIG. 1 show the stored data low, high, high at cells MC[0], MC[1] and MC[N], respectively. As will be explained below, this set of data represents the worst case leakage scenario that can benefit from the disclosed embodiments.

Transistor P3 in conjunction with signal BLEQB, at appropriate time, pre-charges signal line RBL, and may be referred to as a pre-charge circuit. When signal BLEQB is activated (e.g., low), it turns on transistor P3 allowing signal line RBL to be pre-charged to Vdd, which is a desired level for a memory cell MC to be read. When signal BLEQB is deactivated (e.g., high), it turns off transistor P3 disallowing the pre-charge mode for signal line RBL. Generally, circuit 100 is in the read mode when one of the cells MC is in the read mode (e.g., one of the signals RWL[0:n] is activated). Further, before sampling the current leakage, signal line RBL is pre-charged to a high state so that the amount of leakage can be determined. Similarly, before the read operation, signal line RBL is also pre-charged to discriminate the data stored in a memory cell MC to be read. To read signal line RBL, transistor P3 is off so that the pre-charge mode can be turned off.

Sense amplifier inverter SA_IVN inverts the logic state of signal line RBL to output Qout. When a memory cell MC to be read stores a low, signal line RBL is high, and, via inverter SA_IVN, provides a low to output Qout. On the other hand, if the memory cell MC to be read stores a high, signal line RBL starts discharging to a low, turning output Qout to a high via inverter SA_IVN.

In an embodiment, compensation circuit 110, in the leakage sampling phase, determines the amount of current leaked from signal line RBL and thus the voltage level of signal line RBL being pulled down by the leakage current, and stores that leakage information via a capacitive device, e.g., capacitor C in the embodiment of FIG. 1. In the reading phase, compensation circuit 110, based on the stored information, provides current to compensate for the current leaked from signal line RBL.

Transistor P1 (e.g., a PMOS transistor) via signal A controls operation of compensation circuit 110. Signal A in fact controls the operation of transistor P1. When signal A is activated (e.g., low) transistor P1 is on, and when signal A is deactivated (e.g., high) transistor P1 is off. When transistor P1 is on, compensation circuit 110 is enabled and when transistor P1 is off, compensation circuit 110 is disabled.

Transistor P2 (e.g., a PMOS transistor) via the voltage level at node N1 (e.g., voltage V) controls the amount of compensation current. When voltage V is not low, it turns off transistor P2, and when it is low, it biases transistor P2 to provide the compensation current flow from Vdd through transistors P1 and P2 to signal line RBL.

Capacitor C via a first end (e.g., node N1) stores the current leakage information at signal line RBL and when appropriate provides this information via voltage V and transistor P2 to provide the compensation current to signal line RBL.

Voltage V at node N1 controls transistor P2 and therefore also controls the current compensated for the leakage current to signal line RBL. Voltage level V, when appropriate, is the voltage level of signal line RBL being pulled down by the leakage current.

Transmission gate Tg and signals B and B/ provide a connection path between its first end coupled to node N1 and its second end coupled to signal line RBL. During leakage sampling phase transmission gate Tg is on (e.g., forming a closed circuit) allowing current leakage information to be transferred from signal line RBL to node N1. During compensation, transmission gate Tg is off (e.g., forming an open circuit) disconnecting node N1 from signal line RBL and therefore enables voltage V to control transistor P2. Signals B and B/ control the operation of transmission gate Tg (e.g., for it to be closed or open).

Compensation

Embodiments of the invention provide compensation current to improve current leakage from signal line RBL. The amount of compensation current provided depends on the amount of leakage current. The larger the leakage current, the larger the compensation current is provided, and the smaller the leakage current, the smaller the compensation current is provided.

Generally, clock signals are used to synchronize SRAM designs. High performance systems using memories (e.g., SRAM) can operate without skews with a fast system clock. A clock signal provided by a system implementing the SRAM can be used to synchronize the system speed and the SRAM speed. In an embodiment, a rising edge of the clock signal and a delay circuit is used to generate signals read word line (e.g., signals RWL) pulses, and the falling edge of the clock and additional circuitry are used for the sampling phase generation. Embodiments of the invention can utilize this system clock signal.

In an embodiment with a compensation scheme, reading a memory cell MC is separated into two phases, e.g., a leakage sampling phase and an "actual" read phase. Further, the leakage sampling phase occurs at a low cycle of a clock signal while the read phase occurs at the high cycle of the clock signal. The invention, however, is not limited to such operation. That is, the sampling leakage phase can occur at the high cycle while the read phase occurs at the low cycle of the clock, etc.

Figure 2:
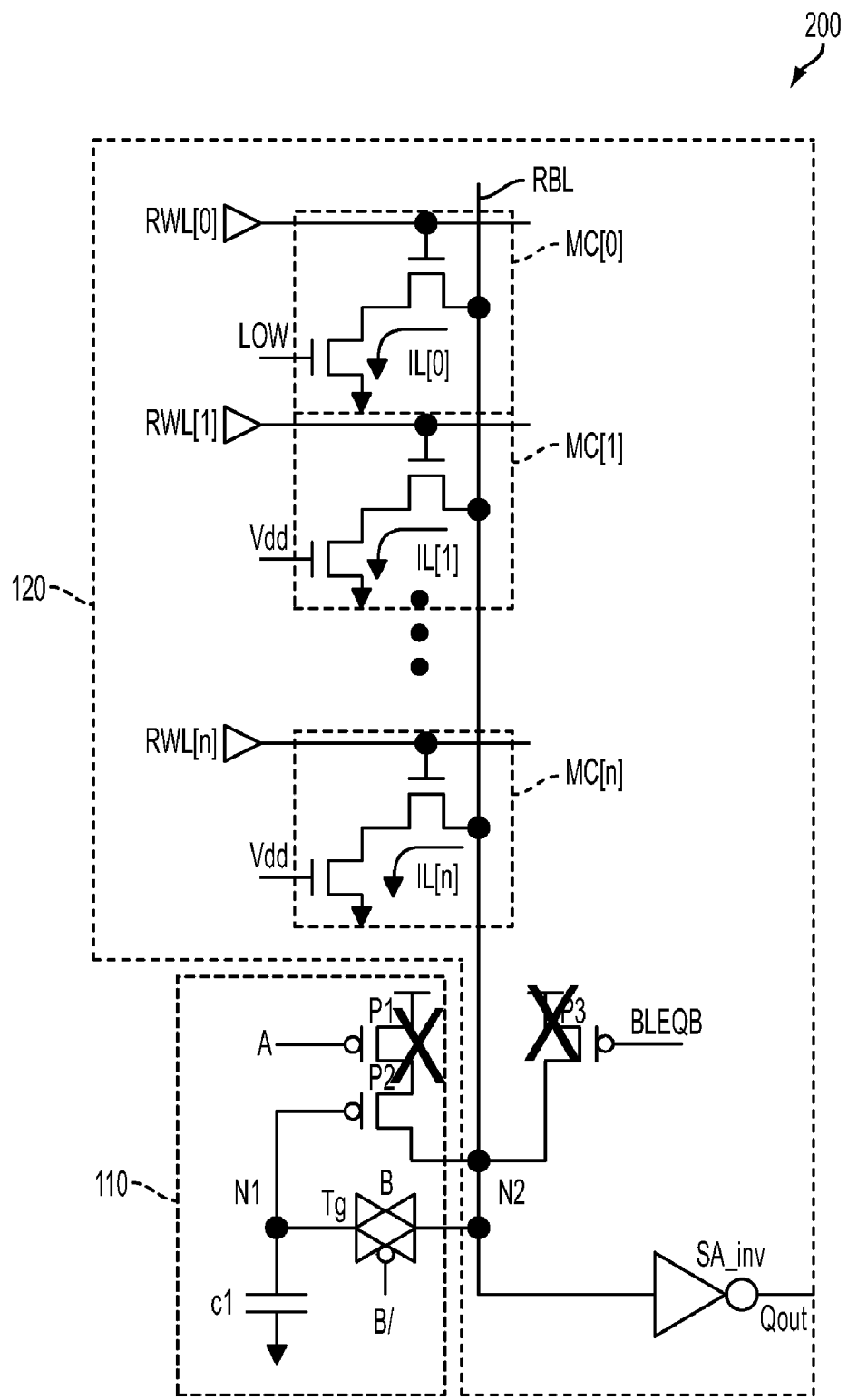
FIG. 2 shows the exemplary circuit of FIG. 1 in a leakage sampling phase, in accordance with an embodiment.

FIG. 2 shows a circuit 200 reflecting circuit 100 in the leakage compensation phase. For simplicity, various labels are not shown. In this phase, compensation circuit 110 is off, i.e., transistors P1 and P2 are off (e.g., marked with an "X"). Transistor P3 is also off (e.g., also marked with another "X"). Before sampling the current leakage signal line RBL is precharged to a high state (e.g., Vdd), which, in various embodiments, is the normal state for this signal line RBL for a read operation.

Because transistor P3 is off, signal line RBL is high, leakage current IL (e.g., the sum of current IL[0], IL[1], . . . , IL[N]), flows from signal line RBL into transistors TR1 and TR2 of memory cells MC as shown. As a result, the voltage level of signal line RBL is pulled down (e.g., dropped) and the amount of dropped voltage (e.g., Vpd) depends on the amount of current being leaked out of signal line RBL (e.g., current IL). The more number of memory cells MC store a high, the higher the leakage current IL flows, and the more signal line RBL is dropped. The amount of leakage current per memory cell MC (e.g., IL[0], IL[1], . . . , IL[N], etc.), depends on circuit implementations, technologies, and the logic level stored in the memory cells MC. Those skilled in the art will recognize that, in the exemplary embodiment of FIG. 1, leakage current per memory cell MC is higher when that cell MC stores a high than when it stores a low. Further, in a scenario having worst case leakage, a memory cell (e.g., memory cell MC[0]) stores a low and all other cells (e.g., memory cells MC[1] to MC[N]) store a high and reading is to occur at the cell storing a low (e.g., cell MC[0]). In this situation, many memory cells MC store a high, a lot of current leaks form signal line RBL and disadvantageously affects the voltage level of signal line RBL. For illustration purposes, circuit 100 shows a worst case scenario where memory cell MC[0] stores a low while other memory cells MC[1] to MC[N] store a high, and reading occurs at cell MC[0].

In an embodiment, the leakage current per memory cell MC ranges from 10 nA to 46 nA. Generally, the lower end of the range (e.g., 10 nA) is for the memory cell MC storing a low and the upper end of the range (e.g., 46 nA) is for a memory cell MC storing a high. For a rough estimation, the total leakage current IL in an embodiment is about 12 μA for an array of 256 memory cells MC. Further, the voltage level of signal line RBL being pulled down by the leakage current for an array of 256 memory cells MC is about 0.4V (e.g., Vpd=0.4V). The voltage level of signal line RBL affected by this pulled-down voltage level Vpd is therefore Vdd−Vpd or Vdd−0.4 V is passed through transmission gate Tg to node N1, and is stored by capacitor C. This voltage level is later used to provide the compensation current.

Figure 3:
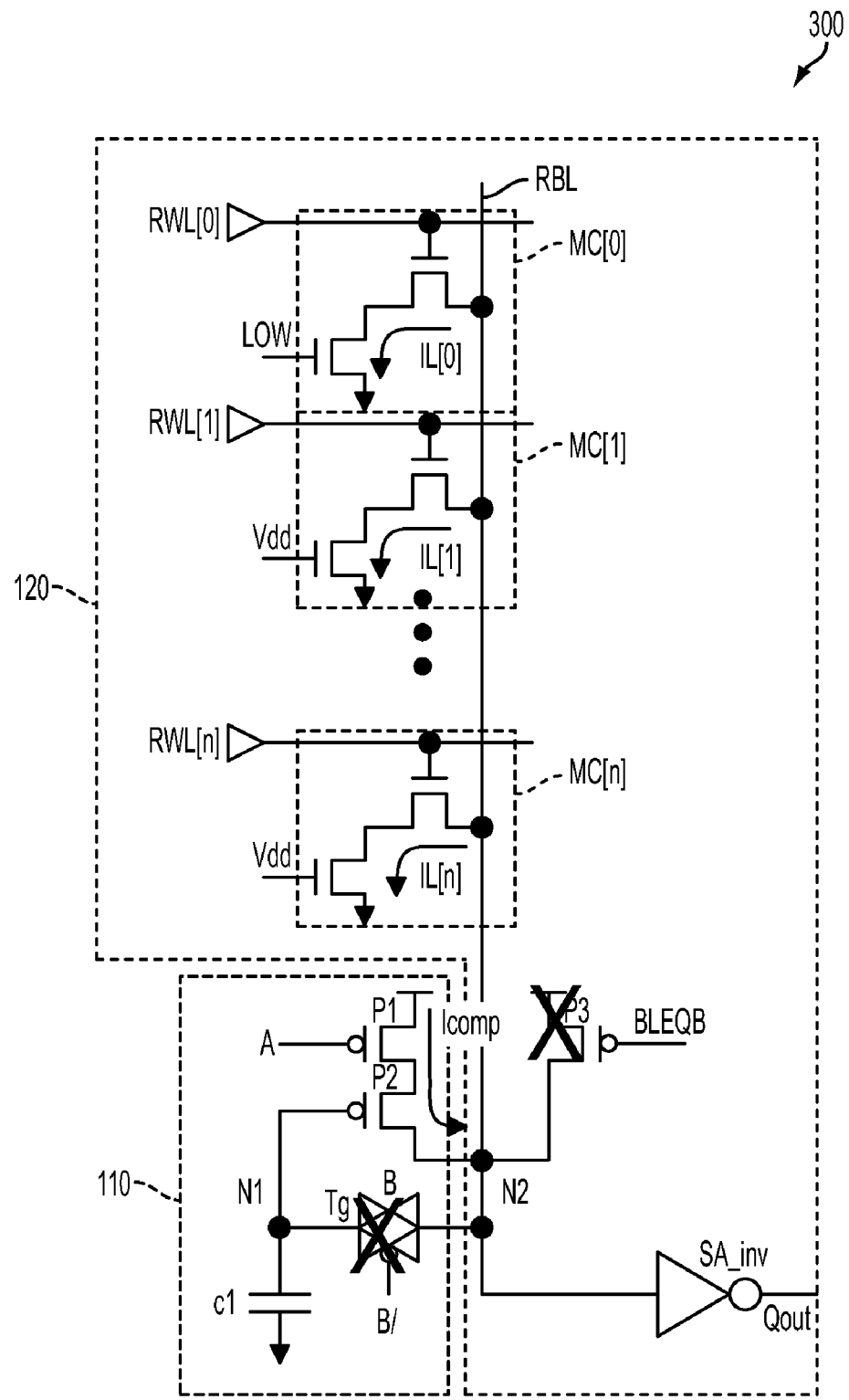
FIG. 3 shows the exemplary circuit of FIG. 1 in a read phase, in accordance with an embodiment.

FIG. 3 shows a circuit 300 reflecting circuit 100 in the reading phase. For simplicity, various labels are not shown. In this read phase, compensation circuit 110 is activated to provide current compensation to signal line RBL. Signal A is activated (e.g., low) to turn on transistor P1. Transmission gate Tg is off to separate node N1 and capacitor C from signal line RBL. Transistor P3 is also off so that signal line RBL is not in the pre-charge mode. As transmission gate Tg and transistor P3 are off, they, for illustration, are marked with an "X."

Embodiments of the invention provide compensation current to compensate for the leakage current. The amount of compensation current depends on the amount of current measured as leakage in the leakage sampling phase (e.g., current IL). In various embodiments, if the leakage current IL is large, the level of signal line RBL is strongly pulled down, which in turns enables lower level for voltage V at node N1. The lower voltage level V at node N1 strongly turns on transistor P2, which in turns provides a larger source-to-drain current (IDS) for transistor P2, which is in fact the compensation current provided to signal line RBL. If the leakage current is small, the voltage level V at node N1 is higher, which weakly turns on transistor P2. As a result, a smaller current IDS for transistor P2 is provided, resulting in a smaller compensation current for signal line RBL.

For illustration, during compensation (e.g., transistor P1 is on), transistor P1 charges node N2 to Vdd. Fort further illustration, the pulled-down voltage Vpd is 0.4V as discussed above. As a result, the voltage from the drain to the source of transistor P2 (e.g., Vdsp2) is Vdd−Vpd−Vdd=Vpd. Further, the voltage from the gate to the source of transistor P2 (e.g., Vgsp2) is Vdd−Vpd−Vdd=Vpd. Because Vdsp2, which is Vpd, equals to Vgdp2, which is also Vpd, transistor P2 operates in the saturation mode. Because the compensation current (e.g., Icomp) is in fact current IDS of transistor P2 in this saturation mode:

$$Icomp = K(|Vgsp2| - |Vtp2|)^2$$

where Vtp2 is the threshold voltage for transistor P2, and, in an embodiment, is about 0.2 V. K is an electrical constant, and, in an embodiment, is about 300 $\mu A/V^2$. Further, Vdsp2=Vpd=0.4 V as illustrated above. As a result, Icomp~12 $\mu A$, which is about the same as leakage current IL of 12 $\mu A$. Those skilled in the art will recognize that the above calculation is a rough estimate for illustration purposes only. Further, even if there is variation between the leakage current IL and the compensation current Icomp, the spirit and scope of embodiments of the invention are maintained because, in various embodiments, it is not required that the compensation current Icomp is exactly the same as the leakage current IL. An amount of current Icomp close to current IL and/or sufficient to pull up signal line RBL to prevent the misread is within the scope of the disclosed embodiments. Additionally, because the leakage current IL was translated into the pulled down voltage Vpd of signal line RBL and is part of the calculation for the compensation current Icomp, embodiments of the invention provide the compensation current Icomp based on the leakage current IL. Alternatively expressed, embodiments of the invention are applicable in various variations of the leakage current.

Illustration Signals

Figure 4:
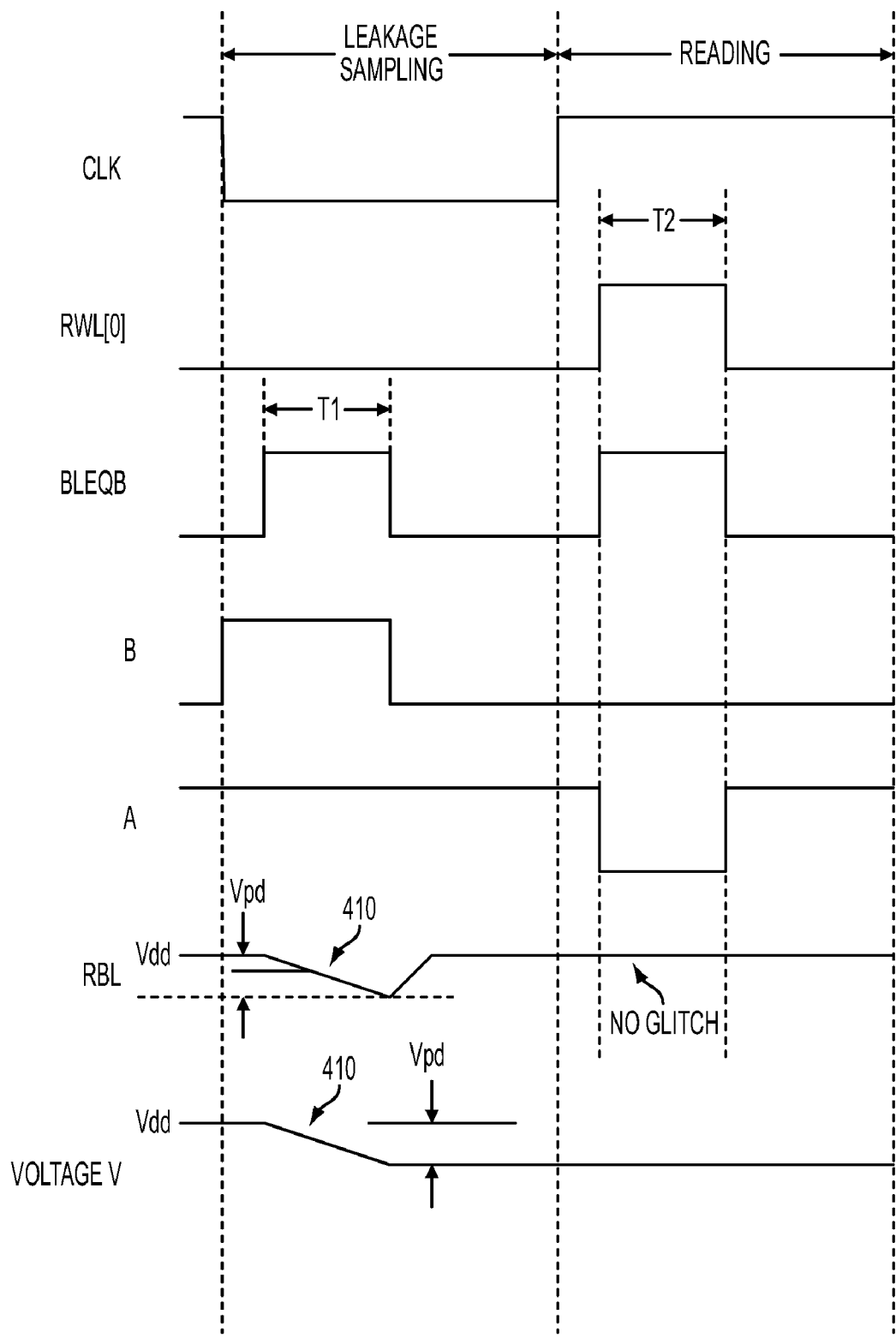
FIG. 4 shows illustrative signals corresponding to the exemplary circuit of FIG. 1.

FIG. 4 shows illustration signals for reading memory cell MC[0] where memory cell MC[0] stores a low while all other cells MC[1] to MC[N] store a high. In some embodiments, this situation indicates the worst case leakage to circuit 100.

In an embodiment, during the leakage sampling phase clock signal CLK is low, signal RWL[0] is also low indicating no memory cell MC is selected for reading.

Signal A is activated (e.g., high) to turn off transistor P1, which, in effect, turns off compensation circuit 100.

Signal B is activated (e.g., high) to allow current to flow from signal line RBL to node N1, which, in effect, allows node N1 to record the leakage current or the voltage level of signal line RBL taking account of the leakage current, which, at this time, is Vdd−Vpd.

Signal BLEQB is raised to a high during time T1 (and T2) to disable the pre-charge mode to signal line RBL. Outside of times T1 and T2, signal BLEBQ is low to activate transistor P3 to pre-charge signal line RBL.

Signal line RBL shows a glitch 410 indicating current IL being leaked from signal line RBL into memory cells MC[0] to MC[N] and thus pulling the voltage level of signal line RBL down an amount of Vpd. The bottom of glitch 410 is Vdd−Vpd.

Voltage level V also shows a glitch 410 having a bottom level at Vdd−Vpd. Because voltage V is transferred to node N1 of capacitor C, at the end of time T1, voltage V, however, stays at Vdd−Vpd.

During the reading phase, signal B is deactivated to disconnect signal line RBL from node N1.

Signal RWL[0] is raised to a high during time T2 so that memory cell MC[0] is selected for reading.

During this time T2, signal A is also activated (e.g., low) to turn on transistor P2 and thus compensation circuit 110.

During time T2, signal BLEQB is de-activated (e.g., high) to turn off transistor P3, disallowing signal line RBL from the pre-charge mode.

Voltage V stays at Vdd−Vpd, which is the voltage level of signal line RBL taking account of the leakage current IL and being pulled down by Vpd.

Due to the compensation mechanisms, signal line RBL shows no glitch indicating the leakage current IL is compensated by current Icomp. Without the compensation of embodiments of the invention (e.g., providing compensation current Icomp), there would be some glitch (e.g., like glitch 410) reflecting the leakage current IL.

A number of embodiments of the invention have been described. It will nevertheless be understood that various variations and/or modifications may be made without departing from the spirit and scope of the invention. For example, various transistors are shown to be NMOS (e.g., transistors TR1, TR2, etc.) and some others (e.g., transistors P1, P2, P3, etc.) are shown to be PMOS, but the invention is not limited to such a configuration because selecting a transistor type (e.g., NMOS or PMOS) is a matter of design choice based on need, convenience, etc. Embodiments of the invention are applicable in all variations and combinations of transistor types. Further, some signals are illustrated with a particular logic level to operate some transistors (e.g., activated high, deactivated low, etc.), but selecting such levels and transistors are also a matter of design choice, and embodiments of the invention are applicable in various design choices. Electronic components (e.g., transistors, P1, P2, P3, transmission gate Tg, capacitor C, etc.) in conjunction with corresponding voltages and current (voltage V, signal A, BLEQB, etc.) are shown to perform a certain function (e.g., provide a compensation current, pre-charge the signal line RBL, store the leakage information, etc.) for illustration only, but similar components and/or circuits may be used to perform the intended functions, and the invention is not limited to a particular circuit or component.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. A method comprising:
during a leakage sampling phase, recognizing a voltage level dropped due to a leakage current associated with a signal line;
storing the voltage level; and
during a reading phase, using the voltage level to provide an amount of compensation current to the signal line,
wherein the leakage sampling phase occurs at a first part of a clock cycle and the reading phase occurs at a second part of the clock cycle.

2. The method of claim 1 wherein the signal line is a read bit line of an SRAM.

3. The method of claim 1 wherein storing the voltage level comprises storing the voltage level to a capacitive device.

4. The method of claim 1 wherein providing the amount of compensation current includes using the voltage level in generating current of a transistor.

5. The method of claim 1 further comprising pre-charging the signal line before the leakage sampling phase.

6. The method of claim 1 further comprising pre-charging the signal line before the reading phase.

7. The method of claim 1 further comprising passing the voltage level to a capacitive device.

8. The method of claim 7 wherein passing the voltage level to a capacitive device includes passing a voltage level of the signal line.

9. The method of claim 1 wherein storing the voltage level includes storing a voltage level of the signal line.

10. A circuit comprising:
a first transistor;
a second transistor coupled to the first transistor;
a capacitive device having a first end coupled to the second transistor;
a voltage level at the first end of the capacitive device; and
a transmission gate having a first end coupled to the first end of the capacitive device and a second end coupled to a signal line;
wherein the voltage level at the first end of the capacitive device includes a voltage level of the signal line taking account of a voltage dropped due to a leakage current associated with the signal line,
wherein the voltage level at the first end of the capacitive device is generated during a leakage sampling phase.

11. The circuit of claim 10 wherein the signal line includes a read bit line of a single-ended read SRAM.

12. The circuit of claim 10 wherein the first transistor and the second transistor include PMOS devices.

13. The circuit of claim 12 wherein the first transistor and the second transistor are in a first state during a leakage sampling phase and in a second state during a reading phase.

14. The circuit of claim 10 wherein the voltage level at the first end of the capacitive device is used to generate an amount of current flowing through the first transistor and the second transistor to the signal line during a reading phase.

15. The circuit of claim 10 further comprising a pre-charge circuit operable to pre-charge the signal line.

16. The circuit of claim 10 wherein the transmission gate is in a first state during a leakage sampling phase and is in a second state during a reading phase.

17. The circuit of claim 16 wherein the leakage sampling phase occurs during a first cycle of a clock signal and the reading phase occurs during a second cycle of the clock signal.

18. A circuit comprising:
a current source; and
a first circuit coupled to the current source and configured to store a voltage level of a signal line affected by a leakage current during a leakage sampling phase and to provide the voltage level to the current source for generating a compensation current that compensates for the voltage level during a reading phase,
wherein the current source comprises a first transistor and a second transistor, and the compensation current is provided by the second transistor operated in a saturation mode.

19. The circuit of claim 18 wherein the first circuit comprises a capacitive device and a transmission gate.

20. The circuit of claim 18 wherein the signal line includes a read bit line of a memory.

* * * * *